(12) United States Patent
Gallagher et al.

(10) Patent No.: US 7,920,416 B2
(45) Date of Patent: Apr. 5, 2011

(54) INCREASED MAGNETIC DAMPING FOR TOGGLE MRAM

(75) Inventors: William J. Gallagher, Ardsley, NY (US); Daniel C. Worledge, Cortlandt Manor, NY (US)

(73) Assignee: International Business Machines Corporation, Armonk, NY (US)

(*) Notice: Subject to any disclaimer, the term of this patent is extended or adjusted under 35 U.S.C. 154(b) by 474 days.

(21) Appl. No.: 12/046,519

(22) Filed: Mar. 12, 2008

(65) Prior Publication Data

US 2009/0235018 A1    Sep. 17, 2009

(51) Int. Cl.
  *G11C 11/14* (2006.01)
(52) U.S. Cl. ........ 365/171; 365/158; 365/173; 365/209; 365/225.5; 365/243.5
(58) Field of Classification Search .................. 365/171, 365/158, 173, 209, 225.5, 243.5
  See application file for complete search history.

(56) References Cited

U.S. PATENT DOCUMENTS

| | | | | |
|---|---|---|---|---|
| 6,967,863 B2 * | 11/2005 | Huai | ............................ | 365/158 |
| 2005/0184839 A1 * | 8/2005 | Nguyen et al. | ................ | 335/173 |
| 2006/0291108 A1 * | 12/2006 | Sbiaa et al. | .............. | 360/324.12 |

OTHER PUBLICATIONS

Bailey et al., "Control of Magnetization Dynamics in Ni81Fe19 Thin Films Through the Use of Rare-Earth Dopants," IEEE Transactions on Magnetics, vol. 37. No. 4; pp. 1749-1754 (Jul. 2001).

* cited by examiner

*Primary Examiner* — Tuan T Nguyen
*Assistant Examiner* — Toan Le
(74) *Attorney, Agent, or Firm* — Vazken Alexanian; Michael J. Chang, LLC

(57) ABSTRACT

Magnetic random access memory (MRAM) devices and techniques for use thereof are provided. In one aspect, a magnetic memory cell is provided. The magnetic memory cell comprises at least one fixed magnetic layer; at least one first free magnetic layer separated from the fixed magnetic layer by at least one barrier layer; at least one second free magnetic layer separated from the first free magnetic layer by at least one spacer layer; and at least one capping layer over a side of the second free magnetic layer opposite the spacer layer. One or more of the first free magnetic layer and the second free magnetic layer comprise at least one rare earth element, such that the at least one rare earth element makes up between about one percent and about 10 percent of one or more of the first free magnetic layer and the second free magnetic layer.

19 Claims, 2 Drawing Sheets

300

400

500

INCREASED MAGNETIC DAMPING FOR TOGGLE MRAM

STATEMENT OF GOVERNMENT RIGHTS

This invention was made with Government support under grant contract number H94003-05-2-0505 awarded by the Defense MicroElectronics Activity (DMEA) of the United States Department of Defense. The Government has certain rights in this invention.

FILED OF THE INVENTION

The present invention relates to data storage, and more particularly, to data storage devices and techniques for use thereof.

BACKGROUND OF THE INVENTION

Semiconductor devices, such as magnetic random access memory (MRAM) devices, use magnetic memory cells to store information. Information is stored in the magnetic memory cells as an orientation of the magnetization of a free layer in the magnetic memory cell as compared to an orientation of the magnetization of a fixed, i.e., reference, layer in the magnetic memory cell. The magnetization of the free layer can be oriented parallel or anti-parallel relative to the fixed layer, representing either a logic "1" or a logic "0." The orientation of the magnetization of a given layer (fixed or free) may be represented by an arrow pointing either to the left or to the right. When the magnetic memory cell is sitting in a zero applied magnetic field, the magnetization of the magnetic memory cell is stable, pointing either left or right.

Typically, an MRAM device comprises a number of word lines and bit lines running above and below an array of magnetic memory cells. The application of a magnetic field from the word lines and bit lines can switch the magnetization of the free layer from left to right, and vice versa, to write information to a given magnetic memory cell.

Several types of MRAM devices exist. In one type, referred to as "Stoner-Wohlfarth MRAM," a single-layer free layer is used to store information. Stoner-Wohlfarth MRAM is an older version of MRAM and is largely considered obsolete for most applications. In another type, referred to as "Toggle MRAM," a multiple-layer free layer, i.e., having two coupled magnetic layers, is used to store information.

To accommodate ever-increasing data processing rates, MRAM devices have to exhibit faster switching times with nanosecond (ns) and picosecond (ps) scale operation being desired for some applications. For example, Bailey et al., "Control of Magnetization Dynamics in $Ni_{81}Fe_{19}$ Thin Films Through the Use of Rare-Earth Dopants," IEEE TRANSACTIONS ON MAGNETICS, vol. 37, no. 4, pgs. 1749-54 (July 2001) (hereinafter "Bailey"), the disclosure of which is incorporated by reference herein, describes ps scale operation, i.e., a ps scale write cycle time, of Stoner-Wohlfarth MRAM devices and using doping to tune the magnetic dynamics thereof. The idea is to use rare earth dopants to increase the damping of the Stoner-Wohlfarth single-layer free layer. Increasing the damping reduces the number of oscillations the free layer makes each time it is switched. Since the total write cycle time includes this oscillation time, increased damping hence reduces the write cycle time. Therefore, in Bailey, damping is increased solely to reduce the write cycle time in single-layer free layer devices.

Stoner-Wohlfarth MRAM was replaced by Toggle MRAM because Stoner-Wohlfarth MRAM suffered from thermally activated half select errors. A half select occurs when a magnetic field pulse is applied to only a word line or only a bit line (a half select pulse). Magnetic memory cells need to survive many repeated half select pulses without accidentally switching. If the magnetic memory cell does switch, it is called a half select error. These errors are thermally activated in that they would not occur at zero temperature, but at room temperature the thermal energy encourages the errors to occur. Thermally activated half select errors are characterized by being proportional to the length of time for which the half select pulse is applied (around 10 ns). Doubling the pulse length doubles the number of errors. Toggle MRAM does not suffer from this type of error.

However, Toggle MRAM is susceptible to a different type of error, called a thermally activated dynamic half select error. The term "dynamic" refers to the fact that the number of errors is independent of the length of time for which the half select pulse is applied. Instead, dynamic errors depend on a rise and fall time of the pulse (around 0.5 ns). The faster the rise and fall time of the pulse, the more errors there are. This is a problem that is not present in Stoner-Wohlfarth MRAM.

Therefore, techniques that minimize, or eliminate, thermally activated dynamic half select errors in Toggle MRAM would be desirable.

SUMMARY OF THE INVENTION

The present invention provides magnetic random access memory (MRAM) devices and techniques for use thereof. In one aspect of the invention, a magnetic memory cell is provided. The magnetic memory cell comprises at least one fixed magnetic layer; at least one first free magnetic layer separated from the fixed magnetic layer by at least one barrier layer; at least one second free magnetic layer separated from the first free magnetic layer by at least one spacer layer; and at least one capping layer over a side of the second free magnetic layer opposite the spacer layer. One or more of the first free magnetic layer and the second free magnetic layer comprise at least one rare earth element, such that the at least one rare earth element makes up between about one percent and about 10 percent of one or more of the first free magnetic layer and the second free magnetic layer.

In another aspect of the invention, another magnetic memory cell is provided. The magnetic memory cell comprises at least one fixed magnetic layer; at least one first free magnetic layer separated from the fixed magnetic layer by at least one barrier layer; at least one second free magnetic layer separated from the first free magnetic layer by at least one spacer layer; and at least one capping layer over a side of the second free magnetic layer opposite the spacer layer. One or more of the capping layer and the spacer layer comprise at least one rare earth element.

In yet another aspect of the invention, yet another magnetic memory cell is provided. The magnetic memory cell comprises at least one fixed magnetic layer; at least one first free magnetic layer separated from the fixed magnetic layer by at least one barrier layer; at least one second free magnetic layer separated from the first free magnetic layer by at least one spacer layer; at least one capping layer over a side of the second free magnetic layer opposite the spacer layer; at least one of: a first rare earth element interfacial layer between the first free magnetic layer and the spacer layer; a second rare earth element interfacial layer between the spacer layer and the second free magnetic layer; and a third rare earth element interfacial layer between the second free magnetic layer and the capping layer.

In still another aspect of the invention, a MRAM device is provided. The MRAM device comprises a plurality of word lines oriented orthogonal to a plurality of bit lines; and a plurality of magnetic memory cells configured in an array between the word lines and bit lines. At least one of the plurality of magnetic memory cells comprises at least one fixed magnetic layer; at least one first free magnetic layer separated from the fixed magnetic layer by at least one barrier layer; at least one second free magnetic layer separated from the first free magnetic layer by at least one spacer layer; and at least one capping layer over a side of the second free magnetic layer opposite the spacer layer. One or more of the first free magnetic layer, the second free magnetic layer, the capping layer and the spacer layer comprise at least one rare earth element.

In still yet another aspect of the invention, a method of writing data to a MRAM device having a plurality of word lines oriented orthogonal to a plurality of bit lines, and a plurality of magnetic memory cells configured in an array between the word lines and bit lines is provided. The method comprises the following steps. A word line current is provided to a given one of the word lines to select all of the magnetic memory cells along the given word line. At least one of the selected magnetic memory cells comprises at least one fixed magnetic layer; at least one first free magnetic layer separated from the fixed magnetic layer by at least one barrier layer; at least one second free magnetic layer separated from the first free magnetic layer by at least one spacer layer; and at least one capping layer over a side of the second free magnetic layer opposite the spacer layer. One or more of the first free magnetic layer, the second free magnetic layer, the capping layer and the spacer layer comprise at least one rare earth element. A bit line current is provided to each of the bit lines corresponding to one or more of the selected magnetic memory cells. The word line current is removed. The bit line current is removed.

A more complete understanding of the present invention, as well as further features and advantages of the present invention, will be obtained by reference to the following detailed description and drawings.

DETAILED DESCRIPTION OF PREFERRED EMBODIMENTS

Figure 1:
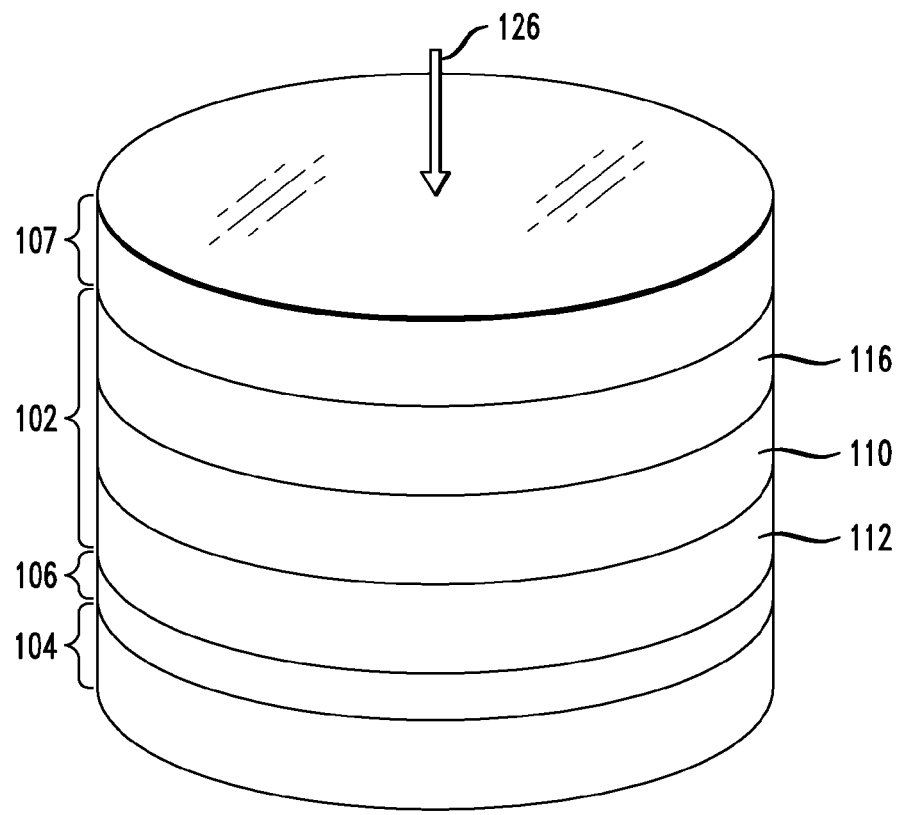
FIG. 1 is a diagram illustrating an exemplary magnetic memory cell according to an embodiment of the present invention.

FIG. 1 is a diagram illustrating exemplary magnetic memory cell 100. Magnetic memory cell 100 comprises tunnel barrier 106 deposited on fixed magnetic layer 104, free magnetic layer 102 deposited on a side of tunnel barrier 106 opposite fixed magnetic layer 104 and capping layer 107 deposited on a side of free magnetic layer 102 opposite tunnel barrier 106.

According to the exemplary embodiment depicted in FIG. 1, magnetic memory cell 100 can be configured, i.e., patterned, to have, when viewed from top-down view 126, a circular (or elliptical) shape. It is to be understood, however, that any other patternable shapes and/or configurations can be employed in accordance with the present teachings. As will be described in detail below, magnetic memory cell 100 may be used in conjunction with a magnetic random access memory (MRAM) device.

As shown in FIG. 1, free magnetic layer 102 is a multiple-layer structure. Namely, free magnetic layer 102 comprises magnetic layer 112 adjacent to tunnel barrier 106. Spacer layer 110 is deposited on a side of magnetic layer 112 opposite tunnel barrier 106. Magnetic layer 116 is deposited on a side of spacer layer 110 opposite magnetic layer 112.

Each of magnetic layers 112 and 116 can comprise any suitable ferromagnetic material(s), including, but not limited to, one or more of nickel (Ni), iron (Fe) and cobalt (Co). Magnetic layer 112 can have a same composition as, or a different composition from, magnetic layer 116. According to an exemplary embodiment, both magnetic layers 112 and 116 comprise NiFe, i.e., $Ni_{81}Fe_{19}$.

Spacer layer 110 couples magnetic layers 112 and 116. According to an exemplary embodiment, spacer layer 110 comprises one or more of ruthenium (Ru), osmium (Os), copper (Cu), chromium (Cr), molybdenum (Mo), rhodium (Rh), rhenium (Re) and iridium (Ir).

As described above, capping layer 107 is present on free magnetic layer 102. According to an exemplary embodiment, capping layer 107 comprises one or more of Ru, tantalum (Ta) and aluminum oxide ($AlO_x$).

According to the present techniques, a rare earth element (s) is used to increase the magnetic damping of magnetic layers 112 and 116, and thereby minimize, or eliminate, thermally activated dynamic half select errors. According to one exemplary embodiment, a rare earth element(s) is alloyed into magnetic layer 112 and/or magnetic layer 116 so as to increase the magnetic damping of these layers. By way of example only, when magnetic layers 112 and 116 comprise NiFe (as described above), adding a rare earth element dopant (s) such as terbium (Tb) and/or cerium (Ce) to magnetic layer 112 and/or magnetic layer 116 will increase magnetic damping in these layers. In one exemplary embodiment, Tb is alloyed into each of the free magnetic layers (i.e., magnetic layers 112 and 116) such that Tb makes up between about one percent (%) and about 10% of each of magnetic layers 112 and 116 (i.e., with Ni, Fe and/or Co making up the balance, i.e., between about 90% and about 99%, of each of magnetic layers 112 and 116). In one preferred configuration, magnetic layers 112 and 116 each comprise 95% $Ni_{81}Fe_{19}$ and five % Tb. While this particular example uses Tb, it is to be understood that, in general, any rare earth element can be used in the same amounts, i.e., between about one % and about 10%, e.g., about five %, to affect an increased damping in magnetic layers 112 and 116. Alternatively, a rare earth element, e.g., Tb, is alloyed into only one of the free magnetic layers, i.e., either magnetic layer 112 or magnetic layer 116, in the proportion(s) described above. This configuration would similarly increase an effective magnetic damping in the free magnetic layer 102, irrespective of into which magnetic layer the rare earth element(s) is added.

Increasing the magnetic damping in the free magnetic layers serves to minimize the magnetization oscillations that, when combined with thermal energy, can lead to half select errors. Magnetic damping is measured by the Gilbert damping constant α. See, for example, FIG. 2 (described below). The amount of rare earth element added to magnetic layers 112 and 116 can be varied from, e.g., five %, depending on the amount of damping desired.

According to an exemplary embodiment, the rare earth element dopant(s) is introduced during formation of magnetic layers 112 and 116. By way of example only, a NiFeTb layer can be deposited over tunnel barrier 106 to form magnetic layer 112. The NiFeTb layer can be deposited from a NiFeTb target, or co-sputtered from a NiFe target and a Tb target. The same process can be used to form magnetic layer 116.

In addition to, or instead of, alloying a rare earth element into magnetic layer 112 and/or magnetic layer 116, it is also possible to increase magnetic damping by introducing a rare earth element(s) into capping layer 107 and/or spacer layer 110. Thus, according to another exemplary embodiment, a rare earth element(s), such as Tb and/or Ce, is alloyed into capping layer 107 and/or into spacer layer 110 (i.e., in the same manner as described with reference to introducing a dopant into magnetic layers 112 and 116, above). Having a rare earth element(s) make up at least a portion of capping layer 107 and/or spacer layer 110 can affect, i.e., increase, the damping in magnetic layers 112 and 116. In one exemplary embodiment, Tb is alloyed into each of capping layer 107 and spacer layer 110 such that Tb makes up between about one % and about 10% of each of capping layer 107 and spacer layer 110 (e.g., with Ru, Ta and/or $AlO_x$ making up the balance, i.e., between about 90% and about 99%, of capping layer 107, and with Ru, Os, Cu, Cr, Mo, Rh, Re and/or Ir making up the balance, i.e., between about 90% and about 99%, of spacer layer 110). For example, Tb can make up about five % of capping layer 107 and/or spacer layer 110. The amount of the rare earth element used in capping layer 107 and/or spacer layer 110 can be varied depending on the amount of damping desired.

Although materials suitable for forming capping layer 107 and spacer layer 110 were presented above, it is also possible to form capping layer 107 and/or spacer layer 110 from a rare earth element(s). Thus, according to yet another exemplary embodiment, capping layer 107 and/or spacer layer 110 are formed entirely from a rare earth element(s), such as Tb and/or Ce. In one exemplary embodiment, Tb is used to form capping layer 107 and spacer layer 110 such that Tb makes up about 100% of each of capping layer 107 and spacer layer 110. Forming capping layer 107 and/or spacer layer 110 from a rare earth element(s) also serves to increase the damping in magnetic layers 112 and 116.

Further, one or more interfacial layer(s) (not shown) comprising a rare earth element(s), such as Tb and/or Ce (hereinafter a "rare earth element interfacial layer") can be used in addition to, or instead of, the above-described techniques, to increase the damping in magnetic layers 112 and 116. Thus, according to still yet another exemplary embodiment, a rare earth element interfacial layer is present at the interface of magnetic layer 112 and spacer layer 110, at the interface of magnetic layer 116 and spacer layer 110 and/or at the interface of magnetic layer 116 and capping layer 107. Rare earth element interfacial layers are described in further detail in conjunction with the description of FIG. 3, below.

Tunnel barrier 106 separates free magnetic layer 102 from fixed magnetic layer 104. Tunnel barrier 106 can comprise any suitable tunnel barrier material, including, but not limited to, one or more of $AlO_x$ and magnesium oxide (MgO). Fixed magnetic layer 104 can comprise any suitable ferromagnetic material, including, but not limited to, one or more of Ni, Fe or Co.

Single domain numerical simulations were carried out to understand the effects of both dynamics and thermal activation on half select errors. In these simulations the Landau-Lifshitz-Gilbert equation was numerically integrated, taking into account applied field, dipole interaction between the two free magnetic layers (magnetic layers 112 and 116), intrinsic anisotropy, demagnetization field of each free magnetic layer (magnetic layers 112 and 116), exchange coupling between the two free magnetic layers (magnetic layers 112 and 116) mediated by the spacer layer (spacer layer 110), thermal activation and Gilbert damping. Thermal activation was taken into account by using a random Langevin field.

To simulate a half select error, a thickness imbalance between the two free magnetic layers (magnetic layers 112 and 116) was assumed. The imbalance simulates the fluctuations in thickness from one magnetic memory cell to another that normally occur in processing that can cause some magnetic memory cells to have a lower magnetization than others. Only the product of magnetization and thickness enters into single domain numerical simulations. Therefore, a magnetization imbalance is equivalent to a thickness imbalance.

The thickness imbalance chosen was small enough that it would not, by itself, cause a half select error if dynamics and thermal activation were not present. However, the combination of thickness imbalance, dynamics and thermal activation were chosen to be sufficient to cause a half select error at least some of the time. Namely, because of the stochastic nature of thermal activation, a half select error occurs with some probability, i.e., not every time.

Figure 2:
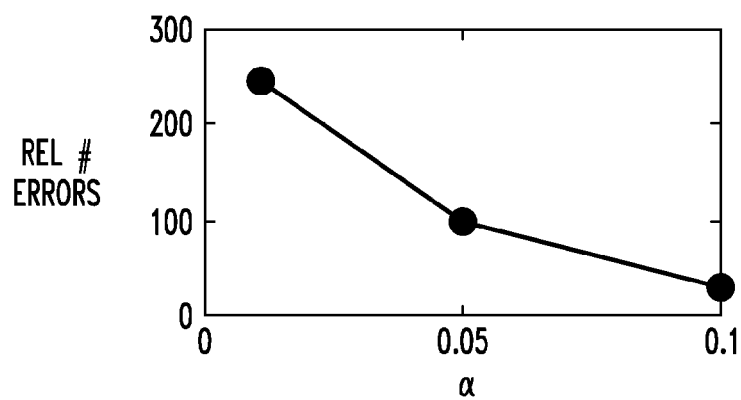
FIG. 2 is a graph illustrating half select errors as a function of the Gilbert damping constant according to an embodiment of the present invention.

FIG. 2 is a graph 200 illustrating a summary of many of the single domain numerical simulations described above. Specifically, graph 200 shows a relative number of half select errors as a function of the Gilbert damping constant, α. For typical values of α equal to 0.01, there are 250 half select errors, and the number of half select errors drops as α is increased. For an increase of α from 0.01 to 0.1, it is possible to decrease the number of half select errors by a factor of five.

Figure 3:
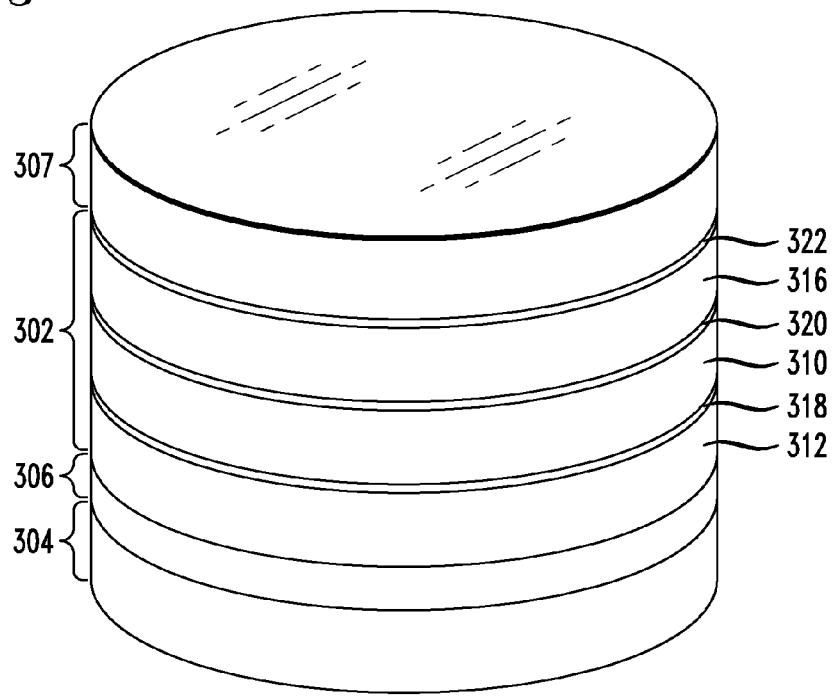
FIG. 3 is a diagram illustrating another exemplary magnetic memory cell according to an embodiment of the present invention.

FIG. 3 is a diagram illustrating exemplary magnetic memory cell 300. Like magnetic memory cell 100, described in conjunction with the description of FIG. 1, above, magnetic memory cell 300 comprises a fixed magnetic layer, i.e., fixed magnetic layer 304, separated from a free magnetic layer, i.e., free magnetic layer 302, by a tunnel barrier, i.e., tunnel barrier 306. A capping layer, i.e., capping layer 307, is present over free magnetic layer 302.

Like free magnetic layer 102 (see FIG. 1, described above), free magnetic layer 302 is a multiple-layer structure comprising two magnetic layers, i.e., magnetic layers 312 and 316, separated by a spacer layer, i.e., spacer layer 310. However, free magnetic layer 302 further comprises at least one rare earth element interfacial layer. For example, free magnetic layer 302 can comprise one or more of a first rare earth element interfacial layer 318 between spacer layer 310 and magnetic layer 312, a second rare earth element interfacial layer 320 between spacer layer 310 and magnetic layer 316 and a third rare earth element interfacial layer 322 between magnetic layer 316 and capping layer 307. The use of at least one of rare earth element interfacial layers 318, 320 and 322 can serve to increase the damping in the free magnetic layers, i.e., in magnetic layers 312 and 316, as described above. According to the exemplary embodiment shown illustrated in FIG. 3, all three rare earth element interfacial layers 318, 320 and 322 are present. This configuration is, however, not required and the presence of any one of rare earth element interfacial layers 318, 320 and 322 would serve to increase the damping in magnetic layers 312 and 316. It is preferable that each rare earth element interfacial layer is formed entirely from a rare earth element(s).

As described above, each rare earth element interfacial layer 318, 320 and 322 comprises at least one rare earth element, such as Tb and Ce. These rare earth element interfacial layers can be deposited during formation of magnetic memory cell 300. By way of example only, a Tb layer can be deposited from a Tb target onto magnetic layer 312 to form rare earth element interfacial layers 318. The same process can be used to form rare earth element interfacial layers 320 and 322.

Figure 4:
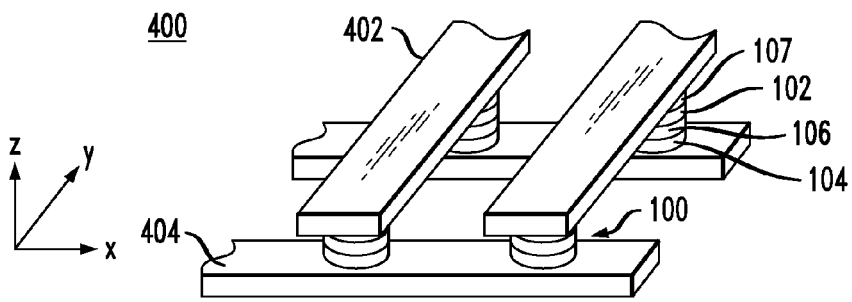
FIG. 4 is a diagram illustrating an exemplary magnetic memory cell array according to an embodiment of the present invention.

FIG. 4 is a diagram illustrating exemplary magnetic memory cell array 400. Magnetic memory cell array 400 can be employed as a Toggle MRAM device.

Magnetic memory cell array 400 comprises bit lines 402 and word lines 404 running orthogonal to each other above and below a plurality of magnetic memory cells 100. Magnetic memory cell 100 was described in conjunction with the description of FIG. 1, above. Alternatively, magnetic memory cell array 400 may comprise a plurality of magnetic memory cells 300 instead of, or in addition to, magnetic memory cells 100. Magnetic memory cell 300 was described in conjunction with the description of FIG. 3, above.

The configuration of magnetic memory cell array 400 shown in FIG. 4 is merely exemplary and other configurations are possible. By way of example only, magnetic memory cell array 400 can be configured to have bit lines 402 run above magnetic memory cells 100 and word lines 404 run below magnetic memory cells 100. Further, the bit lines and/or the word lines may not be electrically connected to each of the magnetic memory cells, e.g., but may be used only to provide the magnetic field for switching. In that case, other lines are present (not shown) which provide the electrical connection to each of the memory cells for read out.

Methods for writing data to magnetic memory cell array 400 will be described in detail, for example, in conjunction with the description of FIG. 5, below. In general, however, each word line 404 applies a magnetic field $H_{word}$ along an x-axis of each magnetic memory cell 100, and each bit line 402 applies a magnetic field $H_{bit}$ along a y-axis of each magnetic memory cell 100. Data is written to magnetic memory cell array 400 by toggling a state, i.e., an orientation of the magnetization of the free layer (free magnetic layer 102 in the case of magnetic memory cell 100) as compared to an orientation of the magnetization of the fixed layer (fixed magnetic layer 104 in the case of magnetic memory cell 100), in a select number of magnetic memory cells in the array, e.g., from a logic "1" state to a logic "0" state, or vice versa. With toggle MRAM, the state of each selected magnetic memory cell, or bit, is always toggled.

Figure 5:
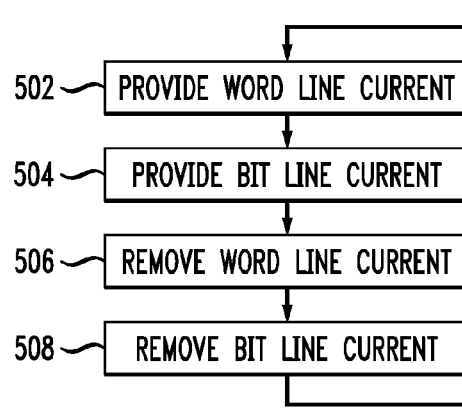
FIG. 5 is a diagram illustrating an exemplary methodology for writing data to a magnetic memory cell array according to an embodiment of the present invention.

FIG. 5 is a diagram illustrating exemplary methodology 500 for writing data to a magnetic memory cell array, such as magnetic memory cell array 400, described in conjunction with the description of FIG. 4, above, having a plurality of word lines oriented orthogonal to a plurality of bit lines and a plurality of magnetic memory cells (e.g., magnetic memory cells 100 and/or magnetic memory cells 300, described above) therebetween.

In step 502, a current is passed along a given one of the word lines (a word line current) thereby half-selecting all of the magnetic memory cells on that given word line (i.e., allowing the magnetic memory cells to be written). According to one exemplary embodiment, there are 256 magnetic memory cells per word line.

In step 504, some or all of the magnetic memory cells selected in step 502, above, are written by sending a current through each corresponding bit line (a bit line current). For example, if eight magnetic memory cells are desired to be written, then a bit line current is sent through each of the eight corresponding bit lines to write data to those eight magnetic memory cells.

In step 506, the word line current is removed. In step 508, the bit line current is removed. As a result, each of the magnetic memory cells selected in step 502, above, is toggled into either a logic "1" or a logic "0" state.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A magnetic memory cell comprising:
   at least one fixed magnetic layer;
   at least one first free magnetic layer separated from the fixed magnetic layer by at least one barrier layer;
   at least one second free magnetic layer separated from the first free magnetic layer by at least one spacer layer; and
   at least one capping layer over a side of the second free magnetic layer opposite the spacer layer,
       wherein the capping layer comprises one or more of ruthenium, tantalum and aluminum oxide, and wherein one or more of the first free magnetic layer and the second free magnetic layer comprise at least one rare earth element, such that the at least one rare earth element makes up between about one percent and about 10 percent of one or more of the first free magnetic layer and the second free magnetic layer.

2. The magnetic memory cell of claim 1, wherein the spacer layer comprises one or more of ruthenium, osmium, copper, chromium, molybdenum, rhodium, rhenium and iridium.

3. The magnetic memory cell of claim 1, wherein the fixed magnetic layer comprises one or more of nickel, iron and cobalt.

4. The magnetic memory cell of claim 1, wherein the barrier layer comprises one or more of aluminum oxide and magnesium oxide.

5. The magnetic memory cell of claim 1, wherein the at least one rare earth element makes up between about one percent and about 10 percent of each of the first free magnetic layer and the second free magnetic layer.

6. The magnetic memory cell of claim 1, wherein the at least one rare earth element makes up about five percent of each of the first free magnetic layer and the second free magnetic layer.

7. The magnetic memory cell of claim 1, wherein the at least one rare earth element is one or more of terbium and cerium.

8. The magnetic memory cell of claim 1, wherein one or more of nickel, iron and cobalt make up between about 90 percent and about 99 percent of each of the first free magnetic layer and the second free magnetic layer.

9. The magnetic memory cell of claim 1, wherein the first free magnetic layer and the second free magnetic layer each comprise 95 percent $Ni_{81}Fe_{19}$ and five percent terbium.

10. A magnetic memory cell comprising:
    at least one fixed magnetic layer;
    at least one first free magnetic layer separated from the fixed magnetic layer by at least one barrier layer;
    at least one second free magnetic layer separated from the first free magnetic layer by at least one spacer layer; and at least one capping layer over a side of the second free magnetic layer opposite the spacer layer,
wherein one or more of the capping layer and the spacer layer comprise at least one rare earth element.

11. The magnetic memory cell of claim 10, wherein the at least one rare earth element makes up between about one percent and about 10 percent of each of the capping layer and the spacer layer.

12. The magnetic memory cell of claim 10, wherein at least one of ruthenium, tantalum and aluminum oxide makes up between about 90 percent and about 99 percent of the capping layer.

13. The magnetic memory cell of claim 10, wherein at least one of ruthenium, osmium, copper, chromium, molybdenum, rhodium, rhenium and iridium makes up between about 90 percent and about 99 percent of the spacer layer.

14. The magnetic memory cell of claim 10, wherein the capping layer and the spacer layer are each formed entirely from the at least one rare earth element.

15. A magnetic memory cell comprising:
at least one fixed magnetic layer;
at least one first free magnetic layer separated from the fixed magnetic layer by at least one barrier layer;
at least one second free magnetic layer separated from the first free magnetic layer by at least one spacer layer;
at least one capping layer over a side of the second free magnetic layer opposite the spacer layer;
at least one of:
a first rare earth element interfacial layer between the first free magnetic layer and the spacer layer;
a second rare earth element interfacial layer between the spacer layer and the second free magnetic layer; and
a third rare earth element interfacial layer between the second free magnetic layer and the capping layer.

16. A magnetic random access memory device, comprising:
a plurality of word lines oriented orthogonal to a plurality of bit lines; and
a plurality of magnetic memory cells configured in an array between the word lines and bit lines, at least one of the plurality of magnetic memory cells comprising:
at least one fixed magnetic layer;
at least one first free magnetic layer separated from the fixed magnetic layer by at least one barrier layer;
at least one second free magnetic layer separated from the first free magnetic layer by at least one spacer layer;
at least one capping layer over a side of the second free magnetic layer opposite the spacer layer;
at least one of:
a first rare earth element interfacial layer between the first free magnetic layer and the spacer layer;
a second rare earth element interfacial layer between the spacer layer and the second free magnetic layer; and
a third rare earth element interfacial layer between the second free magnetic layer and the capping layer,
wherein one or more of the first free magnetic layer, the second free magnetic layer, the capping layer and the spacer layer comprise at least one rare earth element.

17. The magnetic random access memory device of claim 16, wherein the at least one rare earth element makes up between about one percent and about 10 percent of one or more of the first free magnetic layer and the second free magnetic layer.

18. A method of writing data to a magnetic random access memory device having a plurality of word lines oriented orthogonal to a plurality of bit lines, and a plurality of magnetic memory cells configured in an array between the word lines and bit lines, the method comprising the steps of:
providing a word line current to a given one of the word lines to select all of the magnetic memory cells along the given word line, wherein at least one of the selected magnetic memory cells comprises:
at least one fixed magnetic layer;
at least one first free magnetic layer separated from the fixed magnetic layer by at least one barrier layer;
at least one second free magnetic layer separated from the first free magnetic layer by at least one spacer layer;
at least one capping layer over a side of the second free magnetic layer opposite the spacer layer;
at least one of:
a first rare earth element interfacial layer between the first free magnetic layer and the spacer layer;
a second rare earth element interfacial layer between the spacer layer and the second free magnetic layer;
a third rare earth element interfacial layer between the second free magnetic layer and the capping layer,
wherein one or more of the first free magnetic layer, the second free magnetic layer, the capping layer and the spacer layer comprise at least one rare earth element;
providing a bit line current to each of the bit lines corresponding to one or more of the selected magnetic memory cells;
removing the word line current; and
removing the bit line current.

19. The method of claim 18, wherein the at least one rare earth element makes up between about one percent and about 10 percent of one or more of the first free magnetic layer and the second free magnetic layer.

* * * * *